United States Patent
Rotta et al.

(10) Patent No.: US 7,736,185 B2
(45) Date of Patent: Jun. 15, 2010

(54) CONNECTOR SHIELD TERMINATION IN LIMITED CLEARANCE INSTALLATIONS

(75) Inventors: Phillip R. Rotta, Kirkland, WA (US); John P. Crissey, Kent, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/128,770

(22) Filed: May 29, 2008

(65) Prior Publication Data

US 2009/0298335 A1 Dec. 3, 2009

(51) Int. Cl.
*H01R 13/648* (2006.01)

(52) U.S. Cl. .............. 439/607.41; 439/607.44; 439/607.47; 174/74 R; 174/75 C (58) Field of Classification Search ............ 439/607.41, 439/607.44, 607.47, 98; 174/74 R, 75 C, 174/78

See application file for complete search history.

(56) References Cited

U.S. PATENT DOCUMENTS

| | | | | |
|---|---|---|---|---|
| 3,743,748 | A * | 7/1973 | Reeder | 174/75 C |
| 4,124,319 | A * | 11/1978 | Hollingsead | 403/24 |
| 4,234,756 | A * | 11/1980 | Jackula et al. | 174/38 |
| 4,453,797 | A * | 6/1984 | Hollingsead et al. | 439/538 |
| 4,534,608 | A * | 8/1985 | Scott et al. | 439/345 |
| 5,710,393 | A * | 1/1998 | Smith et al. | 174/74 R |
| 5,716,236 | A * | 2/1998 | O'Sullivan et al. | 439/607.5 |
| 7,074,073 | B2 * | 7/2006 | Callahan et al. | 439/491 |
| 7,098,808 | B2 * | 8/2006 | Stone et al. | 340/945 |
| 7,241,173 | B2 * | 7/2007 | Callahan et al. | 439/579 |
| 7,553,187 | B2 * | 6/2009 | Feldman et al. | 439/108 |
| 2006/0234787 | A1 * | 10/2006 | Lee et al. | 455/575.7 |
| 2007/0040658 | A1 * | 2/2007 | Stone et al. | 340/435 |
| 2007/0197095 | A1 * | 8/2007 | Feldman et al. | 439/608 |

OTHER PUBLICATIONS

Glenair, Inc., 527-305, EMI/RFI Backshell Assembly for Size 3 ARINC 600 Series Connectors, F-28, 1 Page, copyright date 2004.

Glenair, Inc., 527-193, EMI/RFI Backshell Assembly for Size 3 ARINC 600 Series Connectors, F-22 through F-23, 2 Pages, copyright date 2004.

Glenair, Inc., 527-248, EMI/RFI Shield Sock Backshell with Strain-Relief and 30 Cable Entries for Size 3 ARINC 600 Series Connectors, F-24 through F-25, 2 Pages, copyright date 2004.

(Continued)

*Primary Examiner*—Gary F. Paumen
(74) *Attorney, Agent, or Firm*—Hope Baldauff Hartman, LLC (57) ABSTRACT

Apparatus and methods provide for the termination of shields within and around a cable at a connector in limited clearance environments. According to embodiments described herein, a shield termination fixture includes a base, at least one insert aperture, at least one retainer, and a mechanism for terminating cable shields. The base attaches to a connector and defines the insert aperture through which a cable will enter the fixture for connection to the connector. A signal wire of the cable is connected to the connector and a wire shield is positioned between a base wall adjacent to the insert aperture and a shield retainer. The shield retainer is secured to the base, compressing and terminating the wire shield. A cable shield may be terminated via compression between a cable shield retainer and the shield retainer, between the shield retainer and the base, or via fixed attachment to a retainer.

19 Claims, 9 Drawing Sheets

OTHER PUBLICATIONS

Glenair, Inc., 527-126, Strain Relief Backshell for Size 3 ARINC 600 Series Connector, F-20 through F-21, 2 Pages, copyright date 2004.

Glenair, Inc., 527-108, EMI/RFI Banding Backshell for Size 3 ARINC 600 Series Connector, F-18 through F-19, 2 Pages, copyright date 2004.

Boeing Part Standard Design Sheets, Connector, Electrical, Rectangular, Plug, Size 3, pp. 10.5.6.97.1 through 10.5.6.97.10; Revision Date Apr. 17, 2006, 10 Sheets.

Glenair, Inc. Catalog entitled, "A World of Interconnect Solutions," ARINC Series 600, website, http://www.glenair.com/backshells/rectangular/arinc600.html, dated May 28, 2008, 3 Pages.

* cited by examiner

CONNECTOR SHIELD TERMINATION IN LIMITED CLEARANCE INSTALLATIONS

BACKGROUND

In aircraft and other vehicle applications, electronics are often configured as "boxes" or line replaceable units (LRUs) that may be quickly and easily removed and re-installed to facilitate rapid swapping of malfunctioning LRUs with operational LRUs. Although LRUs can be mounted in a variety of ways, one commonly used method is to mount the LRU in a mounting tray within the vehicle and electrically connect it to the vehicle by engaging a connector on the rear side of the LRU with a tray connector on the mounting tray. The rear side of the tray connector is connected to a number of cables that are routed away from the tray to the applicable vehicle system.

Each cable typically includes numerous wires that are connected to the tray connector and at least one electrically conductive shield or braid that offers protection from electromagnetic emissions, electromagnetic susceptibility, and electromagnetic crosstalk between wires of one or more cables. The shields must be properly terminated at the tray connector. The signal wire connections and the shield terminations are covered by backshells, which are covers that are mounted to the rear of the tray connectors to provide protection from physical contact, to provide protection from electromagnetic interference (EMI) from outside sources, and to prevent electromagnetic emissions from the cable wires. Electrically conductive cable overbraid shields are terminated to the backshells to protect from EMI and prevent electromagnetic emissions throughout the entire cable.

Space constraints within an aircraft or other vehicle are often significant. As a result, the clearance between a mounting tray and an adjacent cabinet wall may be minimal. To facilitate sliding the LRUs in and out of a vehicle cabinet during removal and installation, the tray connectors and corresponding backshells are typically configured parallel with a rear cabinet wall so that the connectors on the rear of the LRUs may easily engage the tray connectors at the rear of the cabinet. As a result, the cables connected to the rear sides of the tray connectors must traverse the cabinet space between the mounting trays and the adjacent cabinet wall parallel to the cabinet wall and then turn 90 degrees to enter the backshell of the tray connector. The depth of a typical tray connector backshell along with the depth of the required bend radius of a cable to make the 90-degree turn into the backshell while maintaining minimum cable bend radius requirements often consumes the space between the mounting tray and the rear cabinet wall, limiting the clearance for technicians performing installation or maintenance of components within this space.

It is with respect to these considerations and others that the disclosure made herein is presented.

SUMMARY

It should be appreciated that this Summary is provided to introduce a selection of concepts in a simplified form that are further described below in the Detailed Description. This Summary is not intended to be used to limit the scope of the claimed subject matter.

Apparatus and methods described herein provide for the termination of shields within or around a cable in a limited clearance environment. According to one aspect of the disclosure provided herein, a shield termination fixture includes a base with at least one insert aperture, a retainer, and a mechanism for terminating cable shields. The base is configured to connect to a tray connector. The base forms at least one insert aperture that allows for the passage of a cable through the base to the tray connector for installation of a signal wire within the cable to the connector. The cable includes one or more shields for controlling electromagnetic emissions, electromagnetic susceptibility, and electrical crosstalk between wires of the cable or between cables. The retainer is configured to compress the shield of the cable between the base and the retainer for termination.

A cable shield, such as an overbraid shield or braidsock, is used to encompass the cable as it enters the shield termination fixture to minimize EMI on the cable from outside sources and to prevent electromagnetic emissions from the wires within the cable. The cable shield is terminated at the shield termination fixture according to one or more mechanisms. According to one implementation, the mechanism for terminating the cable shield includes soldering or otherwise fixedly attaching the cable shield to the retainer or to a cable shield retainer. According to another implementation, the mechanism for terminating the cable shield includes compressing the cable shield between the retainer and a cable shield retainer.

According to another aspect, a method for terminating a cable at a connector includes routing the cable through an insert aperture within a base of a shield termination fixture. A signal wire of the cable is attached to the connector. A shield of the cable is positioned over a top surface of the base of the shield termination fixture. A retainer is positioned over the top surface of the base and secured to the base, compressing the shield between the base and the retainer. A cable shield may be installed around the cable entering the shield termination fixture and terminated through compression or soldering.

According to yet another aspect, a shield termination fixture includes a base, a shield retainer, and a cable shield retainer. The base includes a number of walls that define insert apertures for passage of a cable through the base to an attached tray connector. The shield retainer is configured to mate with a top surface of one or more base walls and provides for compression of a shield between the shield retainer and the base. The cable shield retainer is positioned over the shield retainer so that the shield retainer is between the cable shield retainer and the base. The cable shield retainer provides for the termination of a cable shield that surrounds the cable as it enters the shield termination fixture.

The features, functions, and advantages that have been discussed can be achieved independently in various embodiments of the present invention or may be combined in yet other embodiments, further details of which can be seen with reference to the following description and drawings.

DETAILED DESCRIPTION

The following detailed description is directed to apparatus and methods for terminating electromagnetic shields and overbraid shields for a cable connected to a connector in limited clearance installations. As discussed briefly above, tray connectors within aircraft electronics cabinets require physical and electromagnetic protection typically provided by backshells that are electrically connected to the individual wire shields and cable overbraid shields. However, conventional connector backshells utilize a significant amount of limited space between the tray connector and a wall of the electronics cabinet, resulting in inadequate space to route interfacing cabling and maintain required minimum cable bend radii, which consequently increases the difficulty of installation, removal, and maintenance of components within this space.

Utilizing the concepts and technologies described herein, a shield termination fixture occupies less space than conventional backshells, provides for decreased entry angles associated with cables entering the fixture, which improves upon the required bend radius of the incoming cables to decrease the amount of space required to turn the cable into the fixture, and provides for efficient termination of wire shields, overbraid shields, and braidsocks that are used to prevent or minimize electrical crosstalk between signal wires and EMI from outside of the cable.

Throughout this disclosure, embodiments are described with respect to an electronics cabinet of an aircraft. It should be understood that the concepts presented herein are equally applicable to cable connectors in any system, subsystem, and/or payload of any platform, including aircraft, ships, vehicles, or any other platform in which wire shields, overbraid shields, and/or braidsocks are to be terminated in limited clearance environments.

Moreover, throughout this disclosure, the term "wire shield" may indicate a metal shielding placed around one or more wires within a cable to prevent or minimize crosstalk and/or EMI. Similarly, the term "cable shield" will be used to describe a metallic structure encompassing an entire cable and formed in a mesh, weaved, braided, or other pattern to allow for flexibility and stretching to provide protection to the cable encompassed by the cable shield from EMI. A cable shield may be a cable "overbraid shield" or a "braidsock." Typically, a cable overbraid shield surrounds a cable for the entire length of the cable. A braidsock is typically a short segment (i.e., 6-18 inches in length) of cable overbraid shield that may be electrically connected to an end of a cable overbraid shield and terminated at a connector. Embodiments described below provide for the termination of a cable shield, whether the cable shield being terminated includes a braidsock or a cable overbraid shield. The cable shield will be further described below with respect to FIG. 2A. Finally, the term "shield" used alone or as "shield of a cable" may be used generally to refer to any shield, including a wire shield, overbraid shield, or braidsock.

Figure 1:
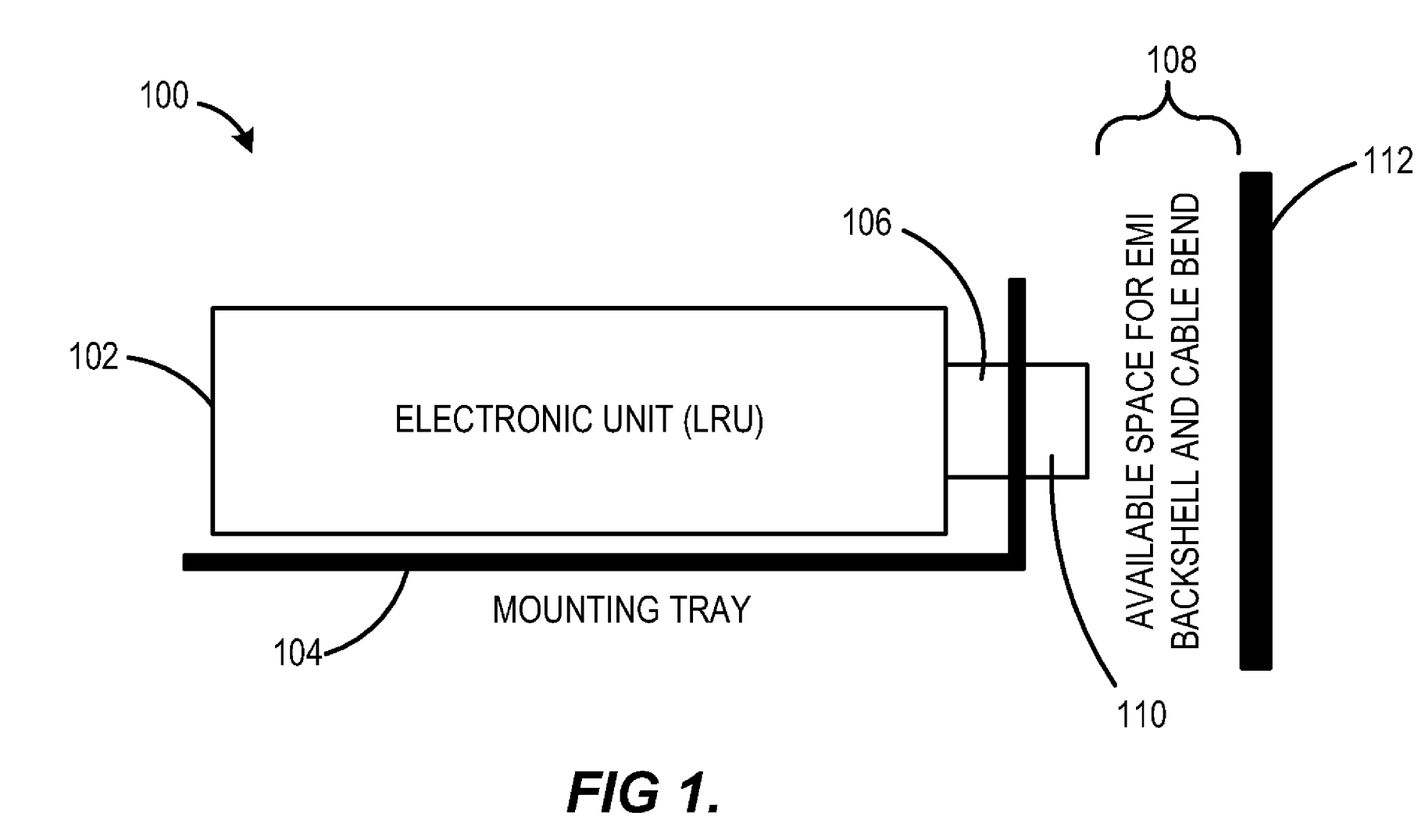
FIG. 1 is a side view of an LRU mounted in an electronics cabinet of an aircraft according to various embodiments presented herein.

In the following detailed description, references are made to the accompanying drawings that form a part hereof, and which are shown by way of illustration, specific embodiments, or examples. Referring now to the drawings, in which like numerals represent like elements through the several figures, shield termination in a limited clearance environment will be described. FIG. 1 shows a limited clearance environment 100 to illustrate the environment in which the various embodiments described herein will be utilized. As seen in FIG. 1, a LRU 102 is installed within an electronics cabinet of an aircraft. The LRU 102 is slid rearward toward a cabinet wall 112 on a mounting tray 104 until the LRU connector 106 engages a tray connector 110. The clearance depth 108 includes the space between the tray connector 110 and the cabinet wall 112 and must accommodate all of the cables corresponding to the tray connector 110, as well as other tray connectors 110 corresponding to additional mounting trays 104 that are not shown within the electronics cabinet.

Figures 2A, 2B:
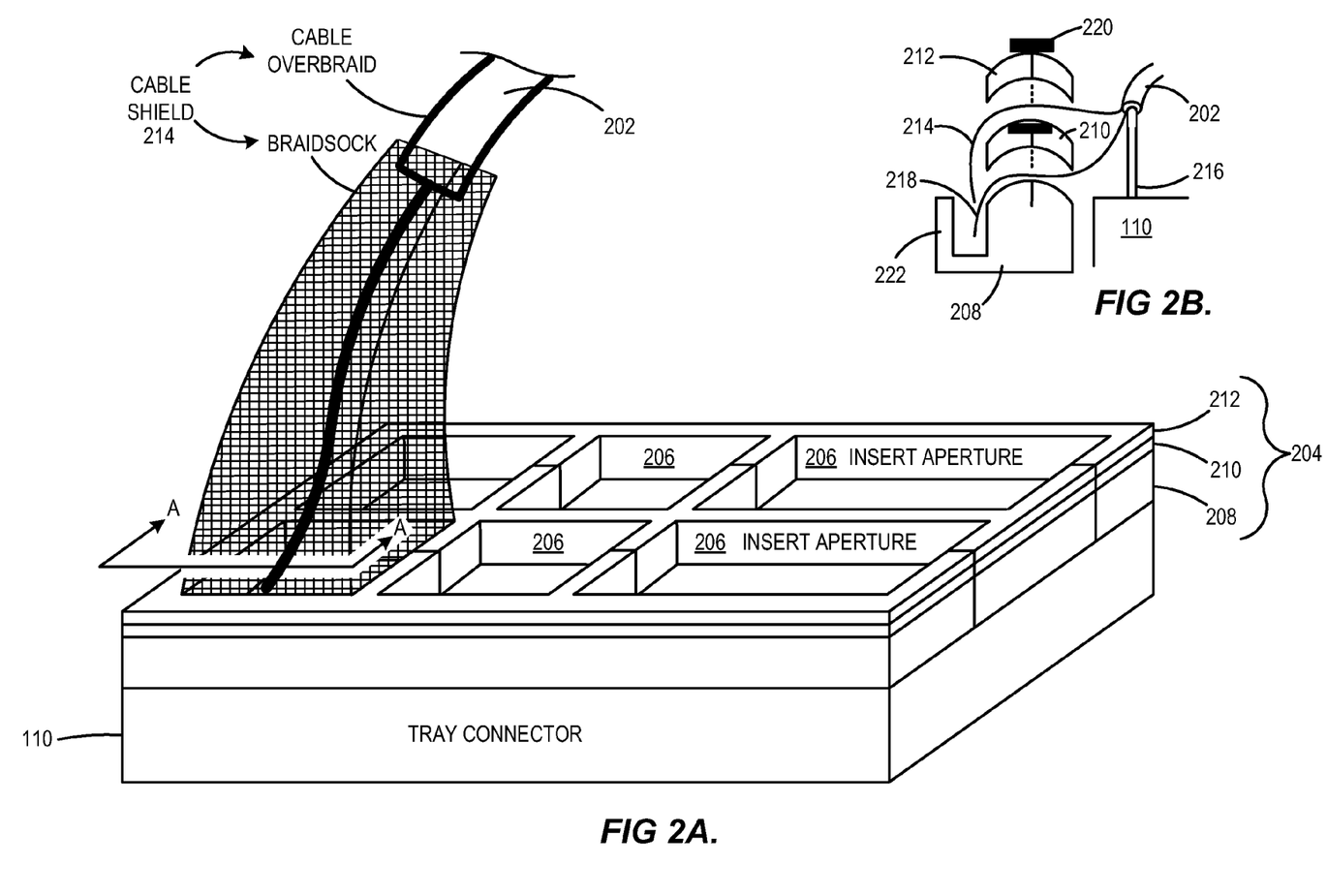
FIG. 2A is a perspective view of an installed shield termination fixture according to various embodiments presented herein.
FIG. 2B is a cross-sectional view along line A-A of a portion of the installed shield termination fixture of FIG. 2A according to various embodiments presented herein.

FIG. 2A shows one embodiment of a shield termination fixture 204 that minimizes the amount of clearance depth 108 utilized to terminate a cable 202 at a tray connector 110. As described above, the cable shield 214 may include a braidsock or a cable overbraid. When a braidsock is used, it is electrically connected to the end of the cable overbraid. An opposing end of the braidsock is then terminated at the shield termination fixture 204. As will be described in detail below, according to various embodiments, the braidsock may be terminated using compression between retainers of the shield termination fixture 204 or by fixedly attaching the braidsock to a retainer. When a braidsock is not used, the cable overbraid extends to and terminates at the shield termination fixture 204 by compressing the cable overbraid between retainers.

According to the embodiment shown in FIG. 2A, the shield termination fixture 204 includes a base 208, a wire shield retainer 210, and a cable shield retainer 212. The base includes any number of walls that create and define a number of insert apertures 206. The insert apertures 206 are holes through which the cables 202 enter the shield termination fixture 204 for connection to the tray connector 110, which is exposed by the insert apertures 206. According to the embodiment shown, the shield termination fixture 204 includes six insert apertures 206 for installation on a connector receiving six cables 202, such as a common ARINC 600 connector. It should be appreciated that any number of insert apertures 206 may be included within the shield termination fixture 204 according to the tray connector 110 to which it is attached.

The wire shield retainer 210 is a structure that may be secured to the base 208 for terminating a wire shield 218 between the wire shield retainer 210 and the base 208 as described below with respect to FIG. 2B. As will become clear from FIGS. 2C-5B and the corresponding description below, the wire shield retainer 210 may be formed as a unified piece of material that is substantially the same size and footprint as the base 208 to which it is attached, may be formed in sections to facilitate installation, may be formed as smaller bars or sections having a different footprint when compared to the base 208 to which it is installed, or any combination thereof.

Figure 2C:
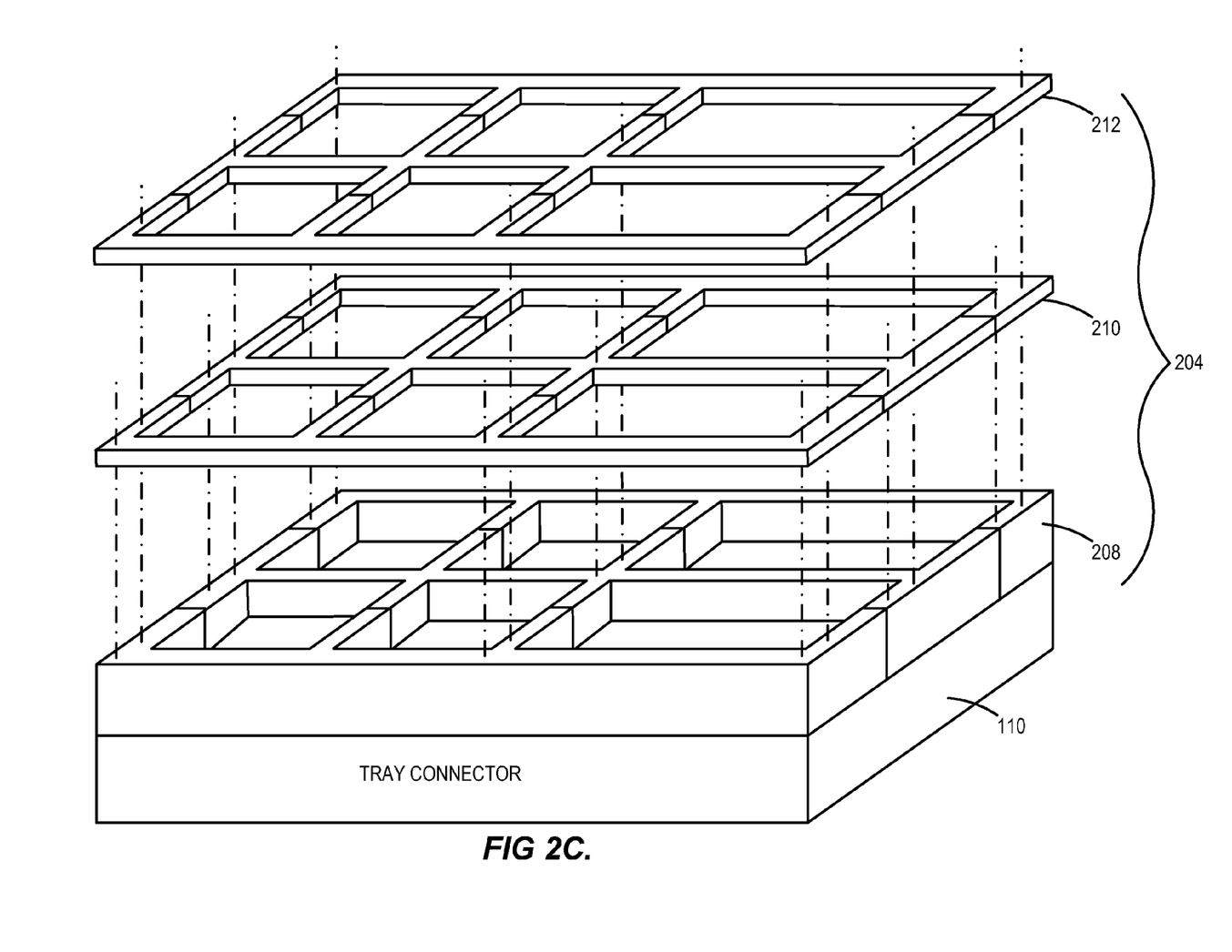
FIG. 2C is an exploded view of the shield termination fixture shown in FIG. 2A according to various embodiments presented herein.

The cable shield retainer 212 is a structure that may be secured to the base 208 or to the wire shield retainer 210 for terminating a cable shield 214 between the cable shield retainer 212 and the underlying wire shield retainer 210. Various embodiments for terminating the cable shield 214 will be described in detail below. FIG. 2C shows an embodiment in which the wire shield retainer 210 and the cable shield retainer 212 are identical in form, mirroring the top surface of the base 208. In this embodiment, the two retainers may be secured to the base, one on top of the other, compressing a cable shield 214 and wire shield 218 between the surfaces. As can be seen in FIG. 2C, each component (the base 208, the wire shield retainer 210, and the cable shield retainer 212) of the shield termination fixture 204 may be manufactured in sections (shown as three sections per component) to facilitate installation. By sectionalizing or splitting the components of the shield termination fixture 204, each component can be installed or removed without removing or disconnecting the cable 202 from the tray connector 110. It should be appreciated that any number and configuration of sections may be utilized without departing from the scope of this disclosure.

Looking now at FIG. 2B, one embodiment for terminating a wire shield 218 and the cable shield 214 will be described. FIG. 2B shows a partial cross-section along line A-A of a similar shield termination fixture 204 and tray connector 110 as that shown of FIG. 2A. The cable 202 includes a signal wire 216 connected to the tray connector 110 and the corresponding wire shield 218 to be terminated. To terminate the wire shield 218, the wire shield 218 is positioned between a top surface of the base 208 and a bottom surface of the wire shield retainer 210. Any number and type of fasteners 220 may be used to secure the wire shield retainer 210 to the base 208. After terminating the wire shield 218, the cable shield 214 may be similarly terminated between the cable shield retainer 212 and the wire shield retainer 210 using additional fasteners 220. It should be noted that the fasteners 220 used for securing the wire shield retainer 210 to the base 208 may be offset from the fasteners 220 used to secure the cable shield retainer 212 to the wire shield retainer 210 and countersunk to prevent interference with the cable shield retainer 212.

It should be understood that the configuration of the base 208, wire shield retainer 210, and cable shield retainer 212 shown in FIG. 2B is slightly different from that shown in FIG. 2A to illustrate different embodiments of the shield termination fixture 204. In FIG. 2B, the top and bottom surfaces of the wire shield retainer 210 and cable shield retainer 212 are convex and concave, respectively, such that they nest within one another and with the convex top surface of the base 208 when secured with the fastener 220. In contrast, the surfaces of the components of the shield termination fixture 204 shown in FIG. 2A are flat. Although the various surfaces are shown as being concave/convex and flat, many geometries may be used, including but not limited to wedges and various complementary male and female knurling features. In the various examples, the wire shield 218 is terminated immediately adjacent to the insert aperture 206, keeping the shield short and minimizing undesirable crosstalk between cables. The short length of the wire shields 218 being terminated utilizing the embodiments described herein provides an advantage over conventional connector backshells.

An additional feature shown in FIG. 2B that is not shown in FIG. 2A is a shield tip protection mechanism 222 for protecting the tips of the wire shield 218 and cable shield 214 from rubbing against another cable, connector, or shield in the electronics cabinet. The shield tip protection mechanism 222 includes a projection of the base 208 outwards and then upwards to create a channel in which the shield tips rest. It should be appreciated that the structure of the base 208 may be altered in any manner to prevent the shield tips from exposure without departing from the scope of this disclosure. Similarly, the shield tip protection mechanism 222 may be incorporated into any other component of the shield termination fixture 204 or may be attached to the shield termination fixture 204.

Figure 3A:
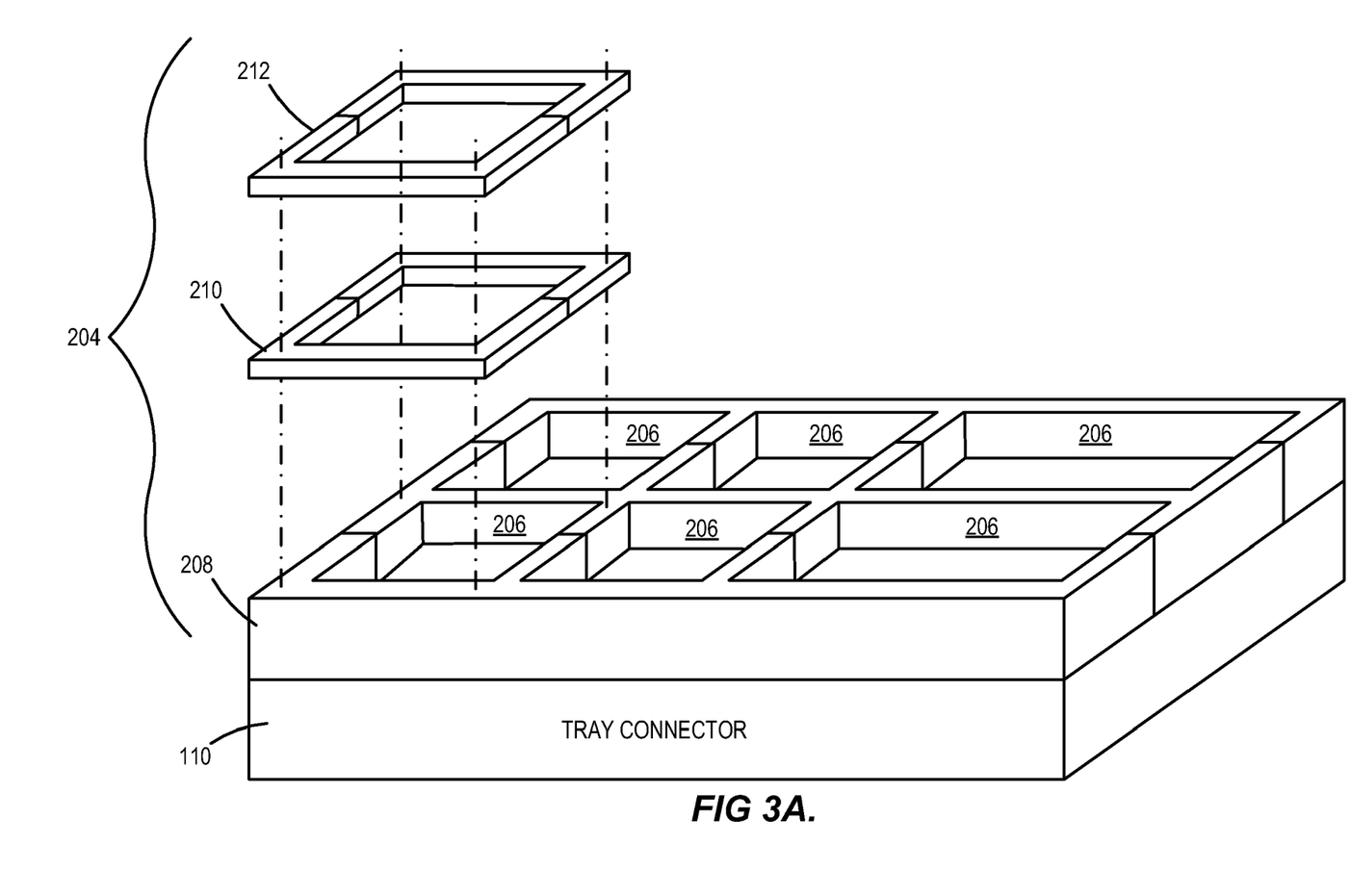
FIG. 3A is an exploded view of an alternative embodiment of a shield termination fixture showing an individual shield retainer and cable shield retainer according to various embodiments presented herein.

FIG. 3A shows an alternative configuration of the shield termination fixture 204 in which the wire shield retainer 210 and the cable shield retainer 212 are sized according to each individual insert aperture 206. Doing so allows for the installation and removal of a cable 202 and the corresponding wire shield 218 and/or cable shield 214 within a single insert aperture 206 without affecting the cable terminations of cables 202 in other insert apertures 206. As seen, the wire shield retainer 210 and the cable shield retainer 212 may be configured in two or more pieces that when installed, form a contiguous, closed loop around the perimeter of the corresponding insert aperture 206.

Figures 3B, 3C:
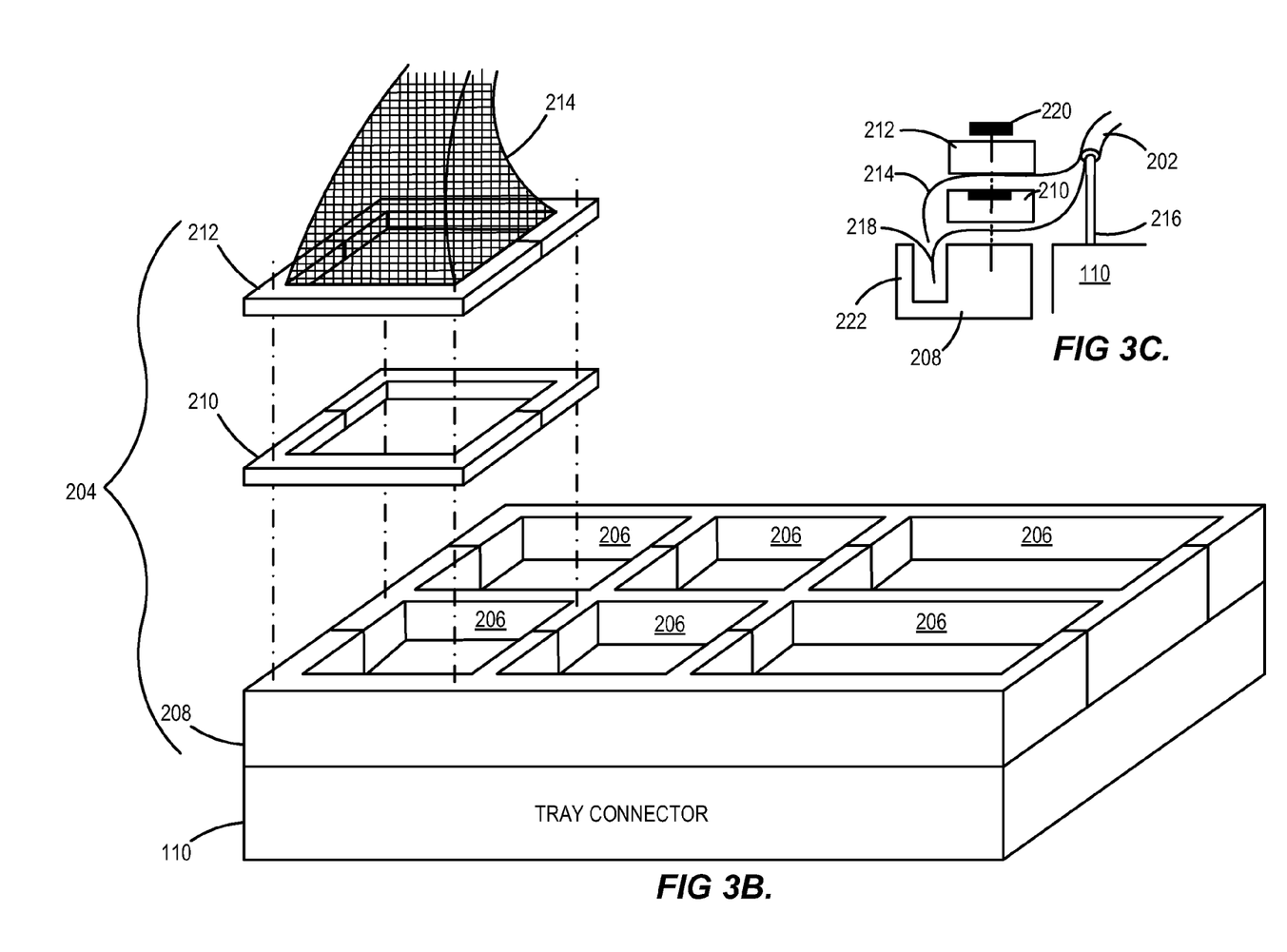
FIG. 3B is an exploded view of an alternative embodiment of a shield termination fixture showing an individual shield retainer and cable shield retainer with an attached cable shield according to various embodiments presented herein.
FIG. 3C is a cross-sectional view of a portion of the installed shield termination fixture of FIG. 3B according to various embodiments presented herein.

FIG. 3B shows the shield termination fixture 204 configuration described above with respect to FIG. 3A with an alternative cable shield termination mechanism to the compression termination described above. Here, the cable shield 214 is fixedly or permanently attached to the cable shield retainer 212. The cable shield 214 may be attached via soldering, conductive adhesive, or any other suitable method for electrically and physically binding the two components. This embodiment allows a technician to utilize a pre-installed cable shield 214 during the cable installation process to simplify the task. As seen in FIG. 3C, the cable shield 214 is fixedly attached to the cable shield retainer 212 so that the technician only has to electrically connect the braidsock, which is pre-installed on the cable shield retainer, to the cable overbraid shield, connect the signal wire 216 to the tray connector 110, position the wire shield 218 between the base 208 and the wire shield retainer 210, secure the wire shield retainer to the base 208 using fasteners 220, and then secure the cable shield retainer 212 to the wire shield retainer using additional fasteners 220. It should be understood that the cable shield 214 may be attached directly to the wire shield retainer 210 without requiring the use of the cable shield retainer 212.

Figures 4A, 4B:
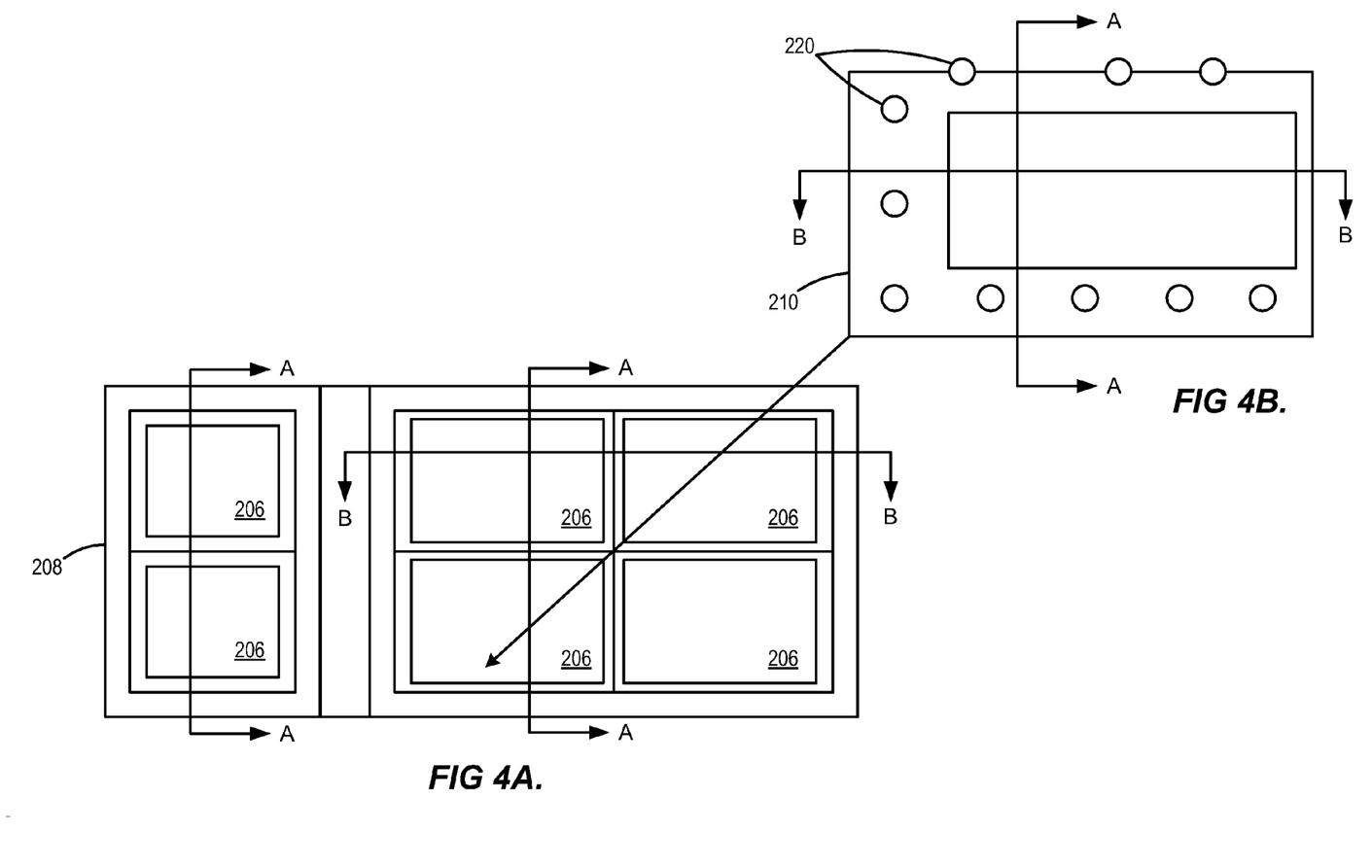
FIG. 4A is a top view of a shield termination fixture utilizing a retainer for each insert aperture for terminating wire shields and cable shields according to various embodiments presented herein.
FIG. 4B is a top view of a retainer for terminating wire shields and cable shields within the shield termination fixture of FIG. 4A according to various embodiments presented herein.
Figure 4C:
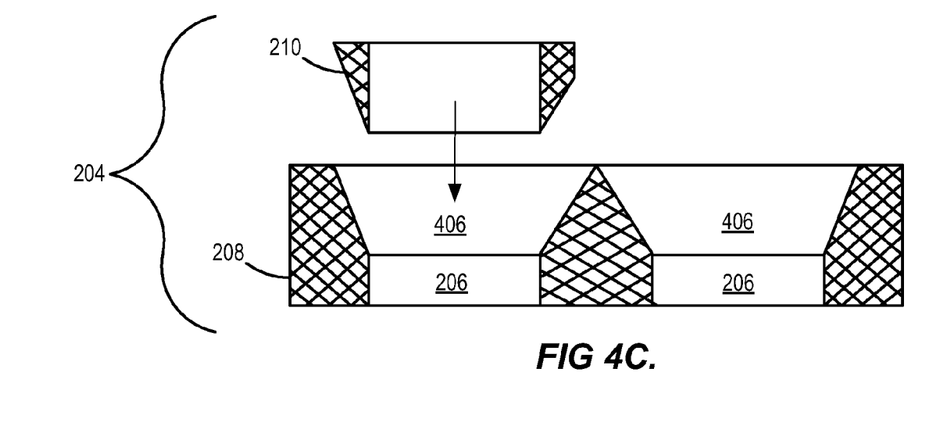
FIG. 4C is a cross-sectional view along line A-A of the shield termination fixture and retainer shown in FIGS. 4A and 4B according to various embodiments presented herein.
Figure 4D:
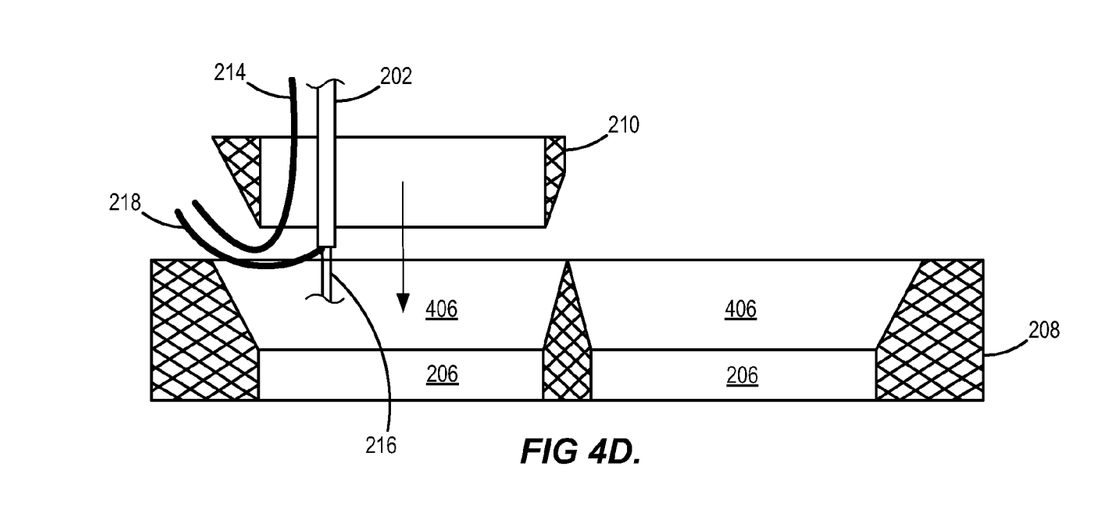
FIG. 4D is a cross-sectional view along line B-B of the shield termination fixture and retainer shown in FIGS. 4A and 4B according to various embodiments presented herein.

An alternative embodiment of a shield termination fixture 204 that utilizes a wire shield retainer 210 without a cable shield retainer 212 is shown in FIGS. 4A-4D. FIGS. 4A and 4B show a base 208 and a wire shield retainer 210 that is configured to install within an insert aperture 206. In this example, there are six insert apertures 206, each having a wire shield retainer 210 installed with fasteners 220. As seen in FIG. 4B, each fastener 220 may be utilized to secure two adjacent shield retainers 210 to the base 208. FIGS. 4C and 4D are cross-sectional views of the base 208 and wire shield retainer 210 along lines A-A and B-B, respectively, of FIGS. 4A and 4B. According to this implementation, the surface of the base walls surrounding the insert apertures 206 extends upward and away from the insert apertures 206 to create an aperture entry 406. An outer surface of the corresponding wire shield retainer 210 is similarly shaped such that the wire shield retainer 210 is configured as a male plug sized for insertion into the female receptacle aperture entry 406. FIG. 4D shows termination of the wire shield 218 and the cable shield 214 by compressing the shields between the wire shield retainer 210 and the base 208.

Figure 5A:
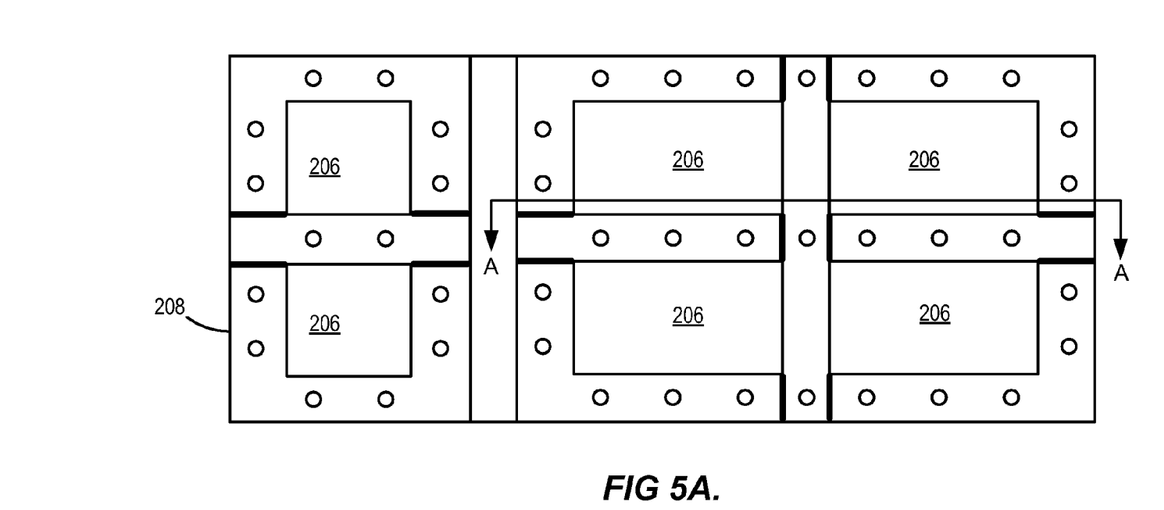
FIG. 5A is a top view of a shield termination fixture utilizing bar clamp retainers for terminating wire shields and cable shields according to various embodiments presented herein.
Figure 5B:
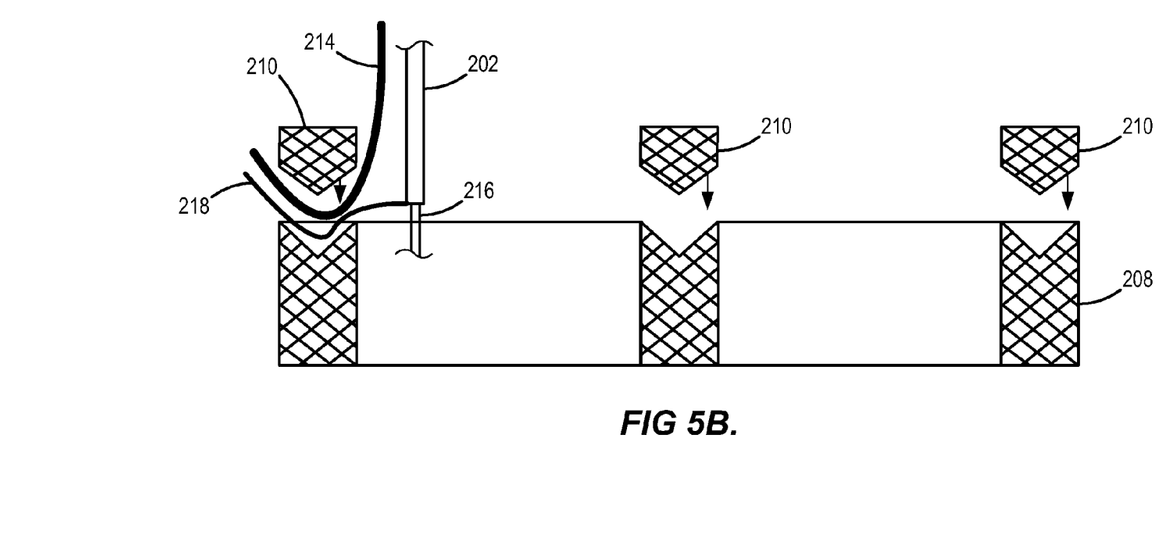
FIG. 5B is a cross-sectional view along line A-A of the shield termination fixture and bar clamp retainers shown in FIG. 5A according to various embodiments presented herein.

Yet another alternative embodiment of the shield termination fixture 204 is shown in FIGS. 5A and 5B. This embodiment utilizes male and female engaging surfaces of the base 208 and wire shield retainer 210 such that the wire shield retainer 210 nests within the base 208, or conversely, such that the base 208 nests within the wire shield retainer 210. In this embodiment, rather than utilizing a wire shield retainer 210 configured in a closed loop around the insert aperture 206, either as a single piece or as multiple contiguous sections, the wire shield retainer 210 is configured as one or more bar clamps secured within one or more recesses in the base 208.

These bar clamps may be configured as linear members or members of various geometry. As one example, the dark lines along the top surface of the base walls surrounding the insert apertures 206 of FIG. 5A show boundaries of various recesses and bar clamps. The bar clamps may be strategically positioned at locations adjacent to the insert apertures 206 for mating with the base 208 and providing compression shield termination.

Figure 6:
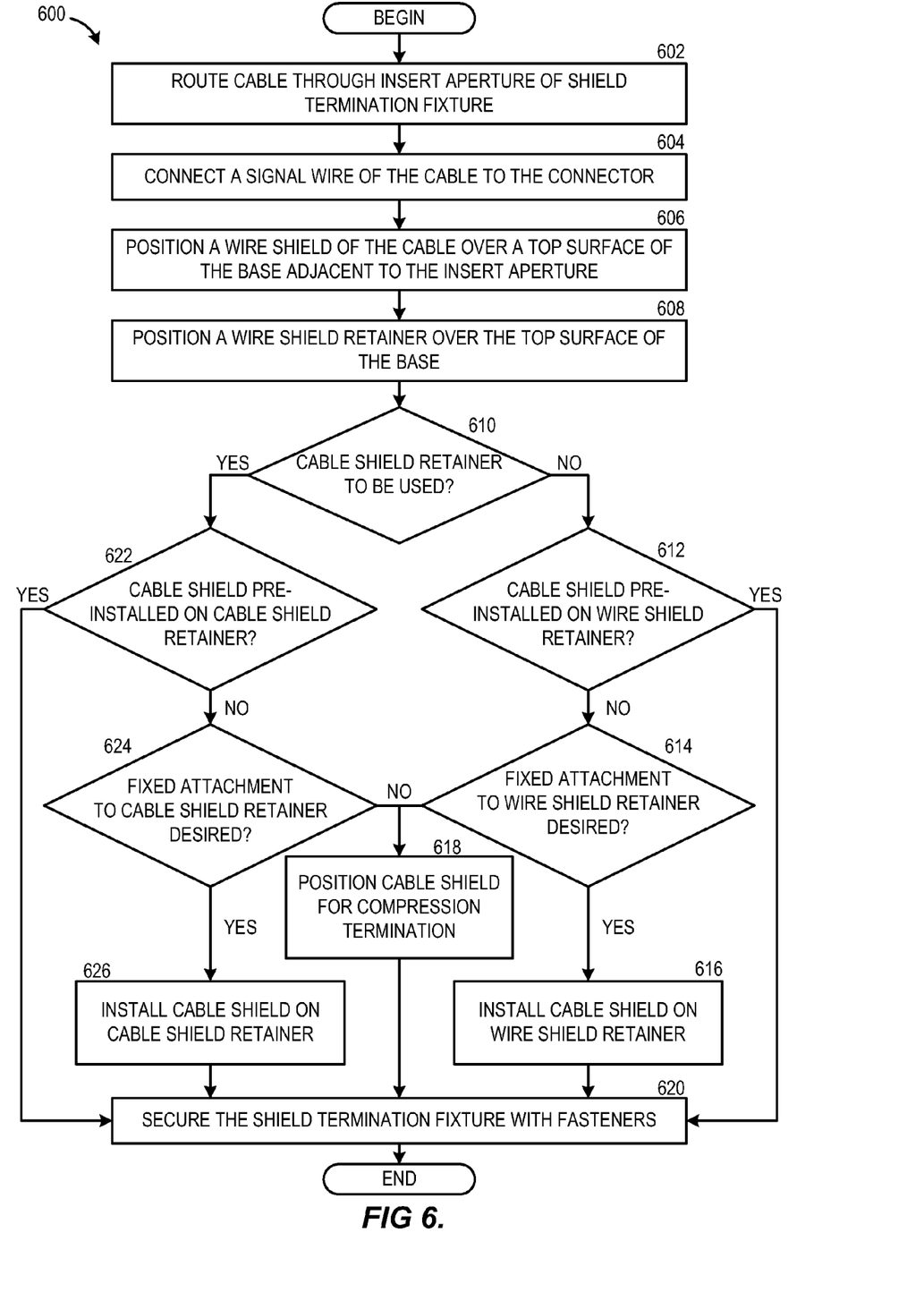
FIG. 6 is a flow diagram illustrating a method for terminating a cable at a connector according to various embodiments presented herein.

Turning now to FIG. 6, an illustrative routine 600 for terminating a cable 202 at a tray connector 110 in a limited clearance environment will now be described in detail. It should be appreciated that more or fewer operations may be performed than shown in the FIG. 6 and described herein. Moreover, these operations may also be performed in a different order than those described herein. The routine 600 begins at operation 602, where the cable 202 is routed through an insert aperture 206 of the shield termination fixture 204. From operation 602, the routine 600 continues to operation 604, where a signal wire 216 of the cable 202 is connected to the tray connector 110.

At operation 606, a wire shield 218 is positioned over a top surface of the base 208 adjacent to the insert aperture 206. The routine 600 continues to operation 608, where a wire shield retainer 210 is positioned over the top surface of the base 208 for fastening. At operation 610, a determination is made as to whether a cable shield retainer 212 is to be used. As described above, according to various embodiments, the cable shield 214 may be terminated at the wire shield retainer 210 rather than utilizing a cable shield retainer 212. If a cable shield retainer 212 is not to be used, the routine 600 proceeds to operation 612, where a determination is made as to whether the cable shield 214 is pre-installed on the wire shield retainer 210. As described above, the cable shield 214 may be soldered or otherwise fixedly attached to the wire shield retainer 210. If a cable shield 214 is pre-installed, then the routine 600 proceeds to operation 620, where the wire shield retainer 210 is secured to the base 208 with fasteners 220 and the routine 600 ends.

However, if at operation 612, a cable shield 214 is not pre-installed on the wire shield retainer 210, the routine 600 continues to operation 614, where it is determined whether a fixed attachment of the cable shield 214 to the wire shield retainer 210 is desired. If a fixed attachment is desired, then the cable shield 214 is installed on the wire shield retainer 210 via soldering or other means at operation 616. The routine continues to operation 620, where the wire shield retainer 210 is secured to the base 208 using fasteners 220 and the routine 600 ends. However, if at operation 614, it is determined that a fixed attachment of the cable shield 214 to the wire shield retainer 210 is not desired, then the routine 600 proceeds to operation 618, where the cable shield 214 is positioned between the wire shield retainer 210 and the base 208 for compression termination. The routine 600 continues from operation 618 to operation 620, where the wire shield retainer 210 is secured to the base 208 and the routine 600 ends.

Returning to operation 610, if a determination is made that a cable shield retainer 212 is to be used, then the routine 600 proceeds to operation 622, where a determination is made as to whether the cable shield 214 is pre-installed on the cable shield retainer 212. If the cable shield 214 is pre-installed, then the routine 600 proceeds to operation 620, where the cable shield retainer 212, wire shield retainer 210, and base 208 are secured together with fasteners 220 and the routine 600 ends. However, if at operation 622, a cable shield 214 is not pre-installed on the cable shield retainer 212, the routine 600 continues to operation 624, where it is determined whether a fixed attachment of the cable shield 214 to the cable shield retainer 212 is desired.

If a fixed attachment is desired, then the cable shield 214 is installed on the cable shield retainer 212 via soldering or other means at operation 626. The routine continues to operation 620, where the cable shield retainer 212, wire shield retainer 210, and base 208 are secured together with fasteners 220 and the routine 600 ends. However, if at operation 624, it is determined that a fixed attachment of the cable shield 214 to the cable shield retainer 212 is not desired, then the routine 600 proceeds to operation 618, where the cable shield 214 is positioned between the cable shield retainer 212 and the wire shield retainer 210 for compression termination. The routine 600 continues from operation 618 to operation 620, where the cable shield retainer 212, wire shield retainer 210, and base 208 are secured together with fasteners 220 and the routine 600 ends.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed is:

1. A shield termination fixture, comprising:
    a base configured to connect to a tray connector;
    at least one insert aperture defined by the base and configured to allow a signal wire of a cable to pass through the base and connect to the tray connector;
    a retainer configured to provide for compression shield termination between the retainer and the base for terminating a wire shield; and
    a cable shield retainer configured to connect to a top surface of the retainer and to terminate an overbraid shield or braidsock surrounding the cable as the cable enters the shield termination fixture.

2. The shield termination fixture of claim 1, wherein the cable shield retainer is configured to compress the overbraid shield or braidsock between a bottom surface of the cable shield retainer and the top surface of the retainer for termination of the overbraid shield or braidsock.

3. The shield termination fixture of claim 1, wherein the overbraid shield or braidsock is fixedly attached around a perimeter of the cable shield retainer.

4. The shield termination fixture of claim 1, wherein the cable shield retainer comprises the overbraid shield or braidsock being fixedly attached to a perimeter of the cable shield retainer.

5. The shield termination fixture of claim 1, wherein the tray connector comprises an ARINC 600 connector and wherein the at least one insert aperture comprises six insert apertures corresponding to a plurality of signal wires of a plurality of cables to be connected to the ARINC 600.

6. The shield termination fixture of claim 1, wherein the retainer comprises a plurality of removable sections such that each of the plurality of removable sections may be mated to the base independently of each remaining removable section.

7. The shield termination fixture of claim 6, wherein the plurality of removable sections comprises a plurality of removable section pairs, each pair configured as a closed loop and positioned on the base to create an extension of an insert aperture.

8. The shield termination fixture of claim 1, wherein a base surface and a retainer surface are configured as male and female engaging surfaces such that one of the base surface or the retainer surface nests within another one of the base or the retainer surface.

9. The shield termination fixture of claim 8, wherein the base surface extends away from the at least one insert aperture around a perimeter of the at least one insert aperture to create an aperture entry for receiving the retainer, and wherein the retainer surface is configured for insertion into the aperture entry of the at least one insert aperture such that the retainer surface abuts the base surface and provides for compression shield termination between the retainer surface and the base surface for the wire shield or for the overbraid shield or braidsock.

10. The shield termination fixture of claim 1, further comprising a shield tip protection mechanism operative to prevent a shield tip from contacting an object external to the shield termination fixture.

11. A method for terminating a cable at a connector, the method comprising:
   routing the cable through an insert aperture of a shield termination fixture;
   connecting a signal wire of the cable to the connector;
   positioning a shield of the cable over a top surface of a base portion of the shield termination fixture adjacent to the insert aperture;
   positioning a retainer over the top surface of the base portion; and
   securing the retainer to the top surface of the base portion such that the shield is compressed between the top surface of the base portion and a bottom surface of the retainer.

12. The method of claim 11, further comprising:
   installing a cable shield around a portion of the cable entering the shield termination fixture; and
   affixing the cable shield to the shield termination fixture.

13. The method of claim 12, wherein affixing the cable shield to the shield termination fixture comprises compressing the cable shield between the top surface of the base portion of the shield termination fixture and the bottom surface of the retainer or compressing the cable shield between a top surface of the retainer and a bottom surface of a cable shield retainer.

14. The method of claim 12, wherein affixing the cable shield to the shield termination fixture comprises soldering the cable shield to the retainer or soldering the cable shield to a cable shield retainer configured to connect to the retainer.

15. The method of claim 11, wherein positioning the retainer over the top surface of the base portion and securing the retainer to the top surface of the base portion comprises:
   positioning a first portion of the retainer over the top surface of the base portion;
   securing the first portion of the retainer to the top surface of the base portion using fasteners that extend through the first portion of the retainer into the top surface of the base portion;
   positioning a second portion of the retainer adjacent to the first portion of the retainer over the top surface of the base portion such that the first portion of the retainer and the second portion of the retainer surround the cable; and
   securing the second portion of the retainer to the top surface of the base portion using fasteners that extend through the second portion of the retainer into the top surface of the base portion,
   wherein the shield is compressed between the top surface of the base portion and the bottom surface of the first portion of the retainer or of the second portion of the retainer.

16. A shield termination fixture, comprising:
   a base configured to mate with a tray connector and comprising a plurality of base walls that define a plurality of insert apertures between the plurality of base walls, each insert aperture configured to allow a signal wire of a cable to pass through the base and connect to the tray connector;
   a shield retainer configured to mate with a top surface of a base wall, wherein the shield retainer provides for compression shield termination between a bottom surface of the shield retainer and the top surface of the base wall for terminating a shield of the cable; and
   a cable shield retainer positioned such that the shield retainer is disposed between the base and the cable shield retainer and configured to provide for termination of a cable shield surrounding the cable as the cable enters the shield termination fixture.

17. The shield termination fixture of claim 16, wherein the shield retainer comprises a bar clamp secured by at least one fastener to a base wall.

18. The shield termination fixture of claim 16, wherein the cable shield is fixedly attached to the cable shield retainer.

19. The shield termination fixture of claim 16, wherein the cable shield retainer is configured to compress the cable shield between the shield termination fixture and the shield retainer to provide for termination of the cable shield.

* * * * *